United States Patent [19]

Uchida

[11] Patent Number: 5,277,930
[45] Date of Patent: Jan. 11, 1994

[54] METHOD OF FABRICATING A SUBSTRATE FOR AN OPTICAL SURFACE MOUNT CIRCUIT

[75] Inventor: Teiji Uchida, 7-6, Chiyogaoka 4-Chome, Asou-Ku, Kawasaki City, Kanagawa Pref., Japan

[73] Assignees: NGK Insulators, Ltd.; Teiji Uchida, both of Japan

[21] Appl. No.: 855,858

[22] Filed: Mar. 23, 1992

Related U.S. Application Data

[62] Division of Ser. No. 689,326, Apr. 23, 1991, Pat. No. 5,195,154.

[30] Foreign Application Priority Data

| Apr. 27, 1990 | [JP] | Japan | 2-113962 |
| Apr. 27, 1990 | [JP] | Japan | 2-113963 |
| Apr. 27, 1990 | [JP] | Japan | 2-113964 |
| Jul. 5, 1990 | [JP] | Japan | 2-176526 |

[51] Int. Cl.$^5$ ............................................. B05D 5/06
[52] U.S. Cl. .................................... 427/162; 427/164; 427/165; 427/282; 427/343; 427/399
[58] Field of Search .............. 427/162, 164, 282, 165, 427/169, 399, 343

[56] References Cited

U.S. PATENT DOCUMENTS

| 4,740,265 | 4/1988 | Bierlein et al. | 427/164 |
| 4,766,954 | 8/1988 | Bierlein et al. | 427/164 |
| 4,781,743 | 11/1988 | Holmes et al. | 427/164 |
| 5,062,688 | 11/1991 | Okuda et al. | 427/164 |

*Primary Examiner*—Janyce Bell
*Attorney, Agent, or Firm*—Parkhurst, Wendel & Rossi

[57] ABSTRACT

A method of producing a substrate for an optical surface mount circuit including the steps of forming an optical wave guide in the substrate, wherein the optical wave guide has a zone of refraction gradient decreasing from a central axis thereof toward surrounding portions thereof, and end surfaces of the optical wave guide are exposed to the front surface of the substrate. Portions of the substrate are masked and salts of metallic cations are contacted to the substrate to form the optical wave guide and the end surfaces thereof.

1 Claim, 18 Drawing Sheets

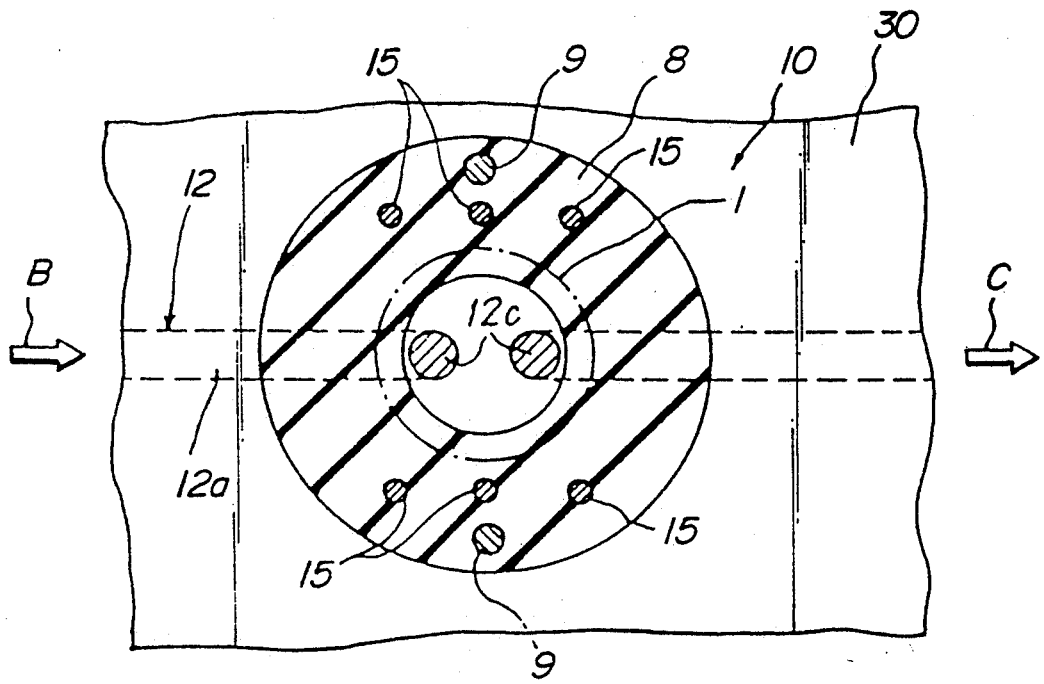
FIG._3
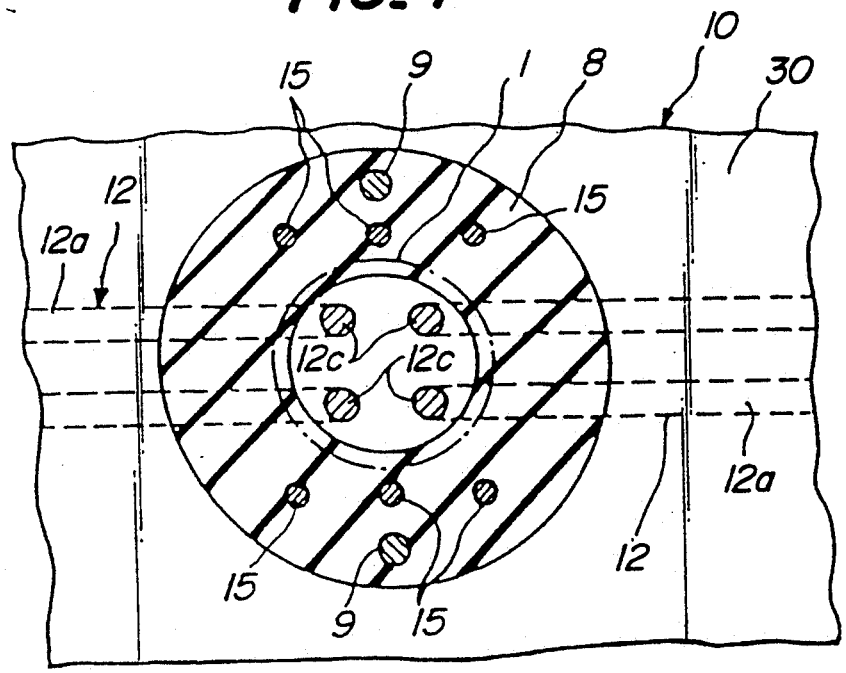
FIG._4

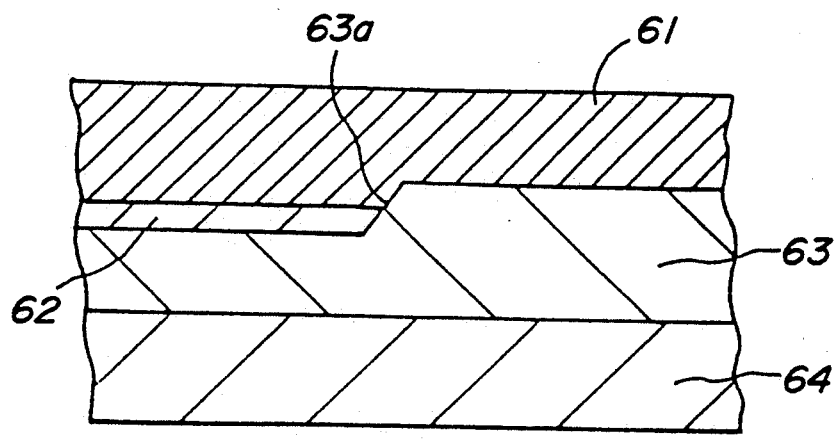
FI.17
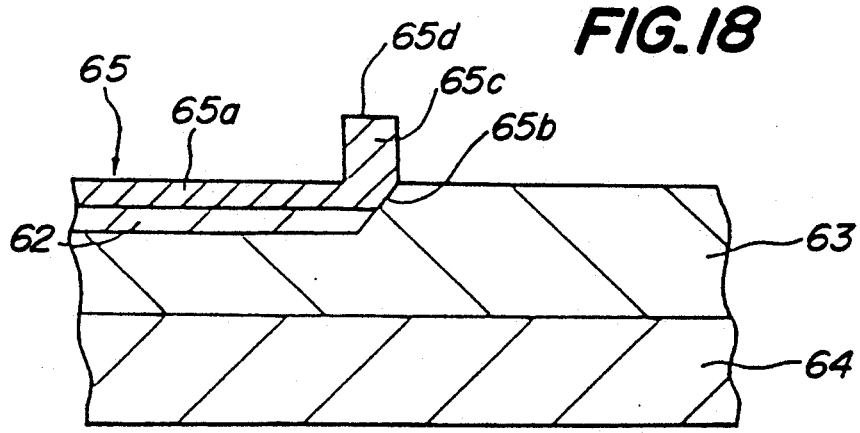
FIG.18
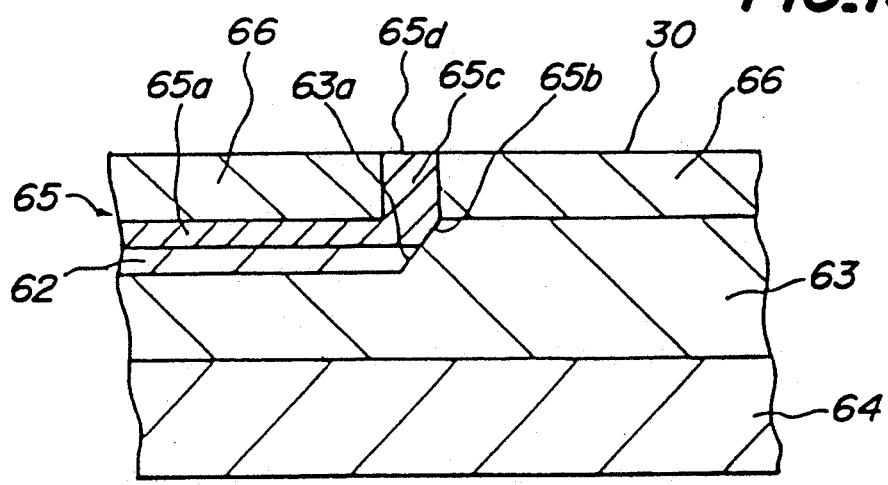
FIG.19

METHOD OF FABRICATING A SUBSTRATE FOR AN OPTICAL SURFACE MOUNT CIRCUIT

This application is a divisional application of Ser. No. 07/689,326, filed Apr. 23, 1991, now U.S. Pat. No. 5,195,154.

BACKGROUND OF THE INVENTION

1. Field of the Invention

The present invention relates to optical surface mount technology. Optical surface mount circuits are based on optical surface mount technology, that optical, opto-electronic, and electrical devices are mounted on the surface of opto-electronic printed wiring boards. Hereinafter, optical surface mount technology, optical surface mount circuit, opto-electronic printed wiring board, opto-electronic surface mount device are abbreviated as O-SMT, O-SMC, OE-PWB, and OE-SMD, respectively.

2. Related Art Statement

Rapidly increasing production of opto-electronic products raises serious problems in the manufacturing process. For instance, almost all fiber-optic communications have shifted to single mode operation, which has resulted in demand of tremendous man-hours for optical alignments and adhesions. One of the authors first proposed Micro-Optics concept in the early period of optical communication development [T. UCHIDA and I. KITANO: Japan Electronic Eng., p22 (Feb. 1969) and T. UCHIDA and S. SUGIMOTO: 8-1, (Invited), 4th ECOC, 1978, Genoa]. Micro-optic devices require a considerable amount of man-hours despite of their reasonably good performances. Silica wave guide IC [T. MIYASHITA et al.: 18D1-1, IOOC 89 (July, 1989, Kobe)] or HOPS (hybrid Optical Packaging on Si [C.H. HENRY, et al.: IEEE J. Lightwave Tech., vol. 7, No. 10, p1530, Oct. 1989]) and OEIC (Opto-Electronic IC) are under intensive development. The serious problems are in mounting these devices on boards, which requires much troublesome work. These problems have not been significantly investigated to date, while packaging technologies for these devices are being well developed.

In current electronics, on the other hand, SMT (Surface Mount Technology) is widely employed in huge and personal computers, communication equipment and home appliances like TV, on account of its merits of high density component mounting and drastic reduction of man hours for board assembly.

O-SMT (Optical Surface Mount Technology [T. UCHIDA: 8th Micro-Optics Seminar Digest, p1, May 1990, Japan]) is intended to present a possible solution to the above-mentioned problems in opto-electronics.

In the meantime, the inventor has formerly proposed in Japanese patent publication No. 48 5,975 (Japanese Patent No. 1002398) a printed type optical circuit as schematically shown in attached FIGS. 15 and 16. That is, depending on a desired pattern, an optical wave guide 32 is formed in a glass substrate 10 extending from one end surface to the other end surface of the glass substrate 10, and the refractive index of the glass substrate 10 is gradually decreased from the central axis of the optical wave guide 32 to the surrounding portion thereof to obtain a circuited substrate for an optical circuit. Usually, when the refractive index is decreased from the central axis of an optical conductor towards the surrounding portion thereof, a light beam passing through the optical wave guide is enclosed therein to assume an optical pass vibrating meandering around the optical axis of the optical wave guide. However, in the aforementioned circuited substrate, an end surface 35 of the optical wave guide 32 is exposed on the end surface of the glass substrate 10, so that an optical part, that is, opto-electronic device, such as a laser diode, etc., has to be attached to the end surface of the glass substrate 10. Hence, a technique of mounting optical parts which is similar to surface mount technology (SMT) in electric systems is not applicable.

In a usual technique of intimately adhering a prism on the optical wave guide to extract a light beam in the optical wave guide it is very difficult in align of the optical axes. Also, a method of using a diffraction lattice to extract a light beam in the optical wave guide has difficulties in mass-producing the diffraction lattice of such minute structure and positioning thereof. In addition, though a method can be considered of providing a groove which penetrates through the optical wave guide 32 from the front surface 30 to the other front surface 31 of the glass substrate 10 in FIG. 16 and fixing the optical part in the groove, the method has drawbacks in practical use in that the processing steps, processing time and processing cost are increased, and alignment of the optical axes is difficult.

SUMMARY OF THE INVENTION

An object of the present invention is to provide O-SMT. In O-SMT, OE-SMD is easily mounted on a front surface of a substrate (OE-PWB) without any troublesome adjustment. O-SMT can easily achieve mass-production, designing of mounting and change of the designing of complicated optical circuits.

Another object of the present invention is to provide an OE-PWB for an optical surface mount circuit on a front surface of which OE-SMDs can easily be mounted and which can easily achieve mass-production, designing of mounting and change of the designing of complicated optical circuits.

A further object of the present invention is to provide a method of producing such OE-PWB.

A still further object of the present invention is to provide OE-SMD which involves a light beam-receiving element, a luminescent element, an electric part, focussing type rod lens and the like individual optical part.

The above objects can now be achieved by the present invention.

In the first aspect, the present invention is an optical surface mount circuit, comprising, a substrate having an optical wave guide and at least two guide holes positioned and fixed relative to end surfaces of the optical wave guide, and an OE-SMD having optical terminals and at least two guide pins at the bottom thereof positioned and fixed relative to the optical terminals, the guide holes and the guide pins being engaged and fixed at the front surface of the substrate, and the optical terminals and the end surface of the optical wave guides being optically connected.

In the second aspect, the present invention is a substrate for optical surface mount circuits, comprising optical wave guides in the interior of the substrate, at least one end surface of the optical wave guides being exposed to the front surface of the substrate.

In the third aspect, the present invention is a method of producing a substrate for optical surface mount circuits, comprising the steps of: forming a desired pattern of a first mask on a front surface of a plate-shaped transparent dielectric body containing metallic cations contacting a salt of metallic cations having a larger ion polarization per unit volume than that of the metallic cations in the plate-shaped transparent dielectric body with a first exposed part of the front surface not coated by the first mask to perform a first ion exchange: removing the first mask from the front surface: subsequently coating a portion of the first exposed part with a second mask; contacting a salt of metallic cations having a smaller ion polarization per unit volume than that of the metallic cations used in the first ion exchange step with a second exposed part of the front surface not coated by the second mask to effect a second ion exchange: and removing the second mask from the front surface, whereby an optical wave guide having a zone of refraction gradient wherein the refraction is decreased from the central axis toward the surrounding portion is formed according to a pattern of the first exposed part, and an end surface of the optical wave guide exposed to the front surface is formed on the portion coated by the second mask.

In the fourth aspect, the present invention is to provide an OE-SMD comprising electric parts for electric circuits, an opto-electric signal transducer for transducing optical signals and electric signals from each other, electric terminals electrically connected to the electric parts for electrically connecting to electric wirings on or in the substrate, and optical terminals having an optical axis aligned with the signal transducer and optically connected to end surfaces of the optical wave guides of the substrate.

The term "optical terminal" used herein means an optical input terminal and/or an optical output terminal.

BRIEF DESCRIPTION OF THE DRAWINGS

For a better understanding of the present invention, reference is made to the accompanying drawings, in which:

FIGS. 1A and 1B are a schematic perspective view of a mounted state of an optical electron accumulated device, respectively, wherein FIG. 1A shows an embodiment of guiding the front surface 30 to protrude the end surface 14, and FIG. 1B shows an embodiment of exposing the end surface 14 without grinding the front surface 30;

FIG. 3 is a schematic cross-sectional view of FIG. 2A along the line A—A:

FIG. 4 is a schematic cross-sectional view of a major portion of a switching device showing its mounted state on the substrate;

FIGS. 5A, 5B and 5C and FIGS. 6A, 6B and 6C are a schematic cross-sectional view of a major portion of another OE-SMD showing its mounted state on the substrate, respectively, wherein FIGS. 5A and 6A show embodiments of protruding the end surface 14 from the front surface 30, FIGS. 5B and 6B show embodiments of fixing selfoc lenses 5, 7 on flange portion 2, and FIGS. 5C and 6C show embodiments of fixing the selfoc lenses 5, 7 on a housing (package) 1 in such a fashion that the end surfaces of the lenses assumes a same level with the bottom surface of the housing 1;

FIGS. 17, 18 and 19 are schematic cross-sectional views of an embodiment of sequential process steps of forming an optical wave guide in a semiconductor PWB substrate;

NUMBERINGS IN THE DRAWINGS

Figure 1A:
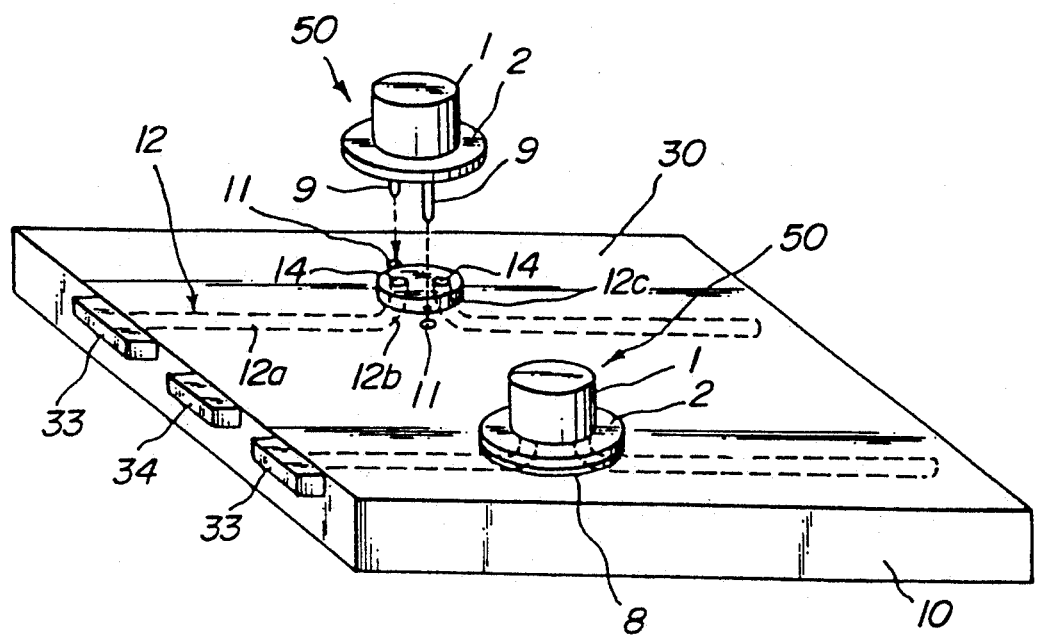

1 . . . housing (package)
2 . . . flange
3 . . . electrically processing device (circuit)
4 . . . light beam-receiving element (photo-detector)
5, 7 . . . selfoc lens (optical input terminal)
6 . . . luminescent element (laser diode or light emitting diode)
8 . . . cushion (rubber, or plastic, or metal, etc.)
9 . . . guide pin
10 . . . glass substrate
11 . . . guide hole
12, 12A, 12B, 12C, 12D, 82 . . . optical wave guide
12a. . . straight portion
12b. . . bend portion
12c. . . end portion
14, 14A, 14B, 14C, 14D . . . end surface
15 . . . electrical input/output terminal
16 . . . optical isolator device
17 . . . birefringent prism as polarizer
18 . . . Faraday's element
19 . . . birefringent prism as analyzer
20 . . . mirror
21 . . . first mask
22 . . . exposed part
26 . . . second mask
30, 31 . . . front surface
32 . . . conventional optical wave guide
33 . . . optical connector
34 . . . electrical connector 41 ... columnar portion of fitting 45
42 ... flange portion of fitting 45
43 ... optical fiber
43a ... core of optical fiber 43
43b ... end surface of core 43a
44, 51 ... plug
45, 52 ... precise metallic fitting
46 ... cushion of rubber, resin, or metal
50, 60, 70 ... optical electron accumulated device
53 ... mixing rod
63 ... Si layer (semiconductor layer)
64 ... electrically insulative layer
65 ... $Si_3N_4$ or $SiO_2$-$TiO_2$ optical wave guide
65a ... straight portion
65b ... mirror portion
65c ... end portion
65d ... end surface
66 ... cladding layer
67 ... base plate
68 ... optical fiber
69 ... end surface of optical fiber 68
71 ... surface layer
72 ... resin substrate
80 ... leaf spring
80a ... flange of leaf spring 80
80b ... pressing portion of spring 80
81a ... stud
81b ... bore
82 ... optical wave guide
82a ... end surface of optical wave guide 82
85, 87 ... selfoc lens
85a, 87a ... mirror portion
90 ... light beam-reflecting membrane (metallic thin film or layered reflecting membranes of dielectric bodies)

DESCRIPTION OF THE PREFERRED EMBODIMENTS

Hereinafter, the present invention will be explained in more detail with reference to examples.

EXAMPLE 1

Referring to FIGS. 1-3, a state of mounting an OE-SMD on a plate-shaped transparent dielectric body glass substrate 10 is shown.

In the interior of the glass substrate 10 a total of 4 columns of optical wave guide 12 are formed each of which consists of a straight portion 12a, a bend portion 12b, and an end portion 12c. The end surfaces of the straight portions 12a are exposed to the end surface of the glass plate 10 and connected to optical connectors 33. The optical connectors 33 are fitted and fixed to other devices or optical circuits (not shown). The end portions 12c are formed to stand vertically to front surfaces 30, 31 of the glass substrate 10, while exposing the end surfaces 14 of the end portions 12c to the front surface 30. For a pair of end surfaces 14 exposed to the front surface 30 a pair of guide holes 11 are bored with a desired angle of, for example, 90°. The end surfaces 14 and the pair of guide holes 11 are positioned and fixed relative to each other.

On or below the surface 30 and 31 of the glass substrate 10 is arranged a desired printed electric wiring directly or through a buffer layer (not shown), which is connected to an electric connector 34. The technique per se of arranging a printed electric wiring is well known, so that explanations thereof are omitted herein.

On the glass substrate 10 is mounted an OE-SMD 50 via a cushion ring 8 such as rubber, plastic and metal. Explaining more concretely, a pair of guide pins 9 and six electrical input/output terminals 15 are arranged on a flange ring 2 at the bottom of the OE-SMD 50, the pair of guide pins 9 are fitted and fixed to corresponding guide holes 11, respectively, and the terminal 15 is connected to a printed electric wiring by soldering. The end surfaces 14 of the optical wave guide 12 are intimately contacted with end surfaces of a pair of selfoc lenses 5, 7 and connected thereto at the end surfaces. Thus, the selfoc lens 5 functions as an optical input terminal, while the selfoc lens 7 functions as an optical output terminal. The end surfaces of the selfoc lenses 5, 7 are positioned and fixed relative to the pair of guide pins 9. In a housing 1 of the optical electron accumulated device 50 are accommodated and fixed the pair of selfoc lenses 5, 7, a light beam-receiving element 4, a luminescent element 6, and an electrical circuit 3.

Figure 2A:
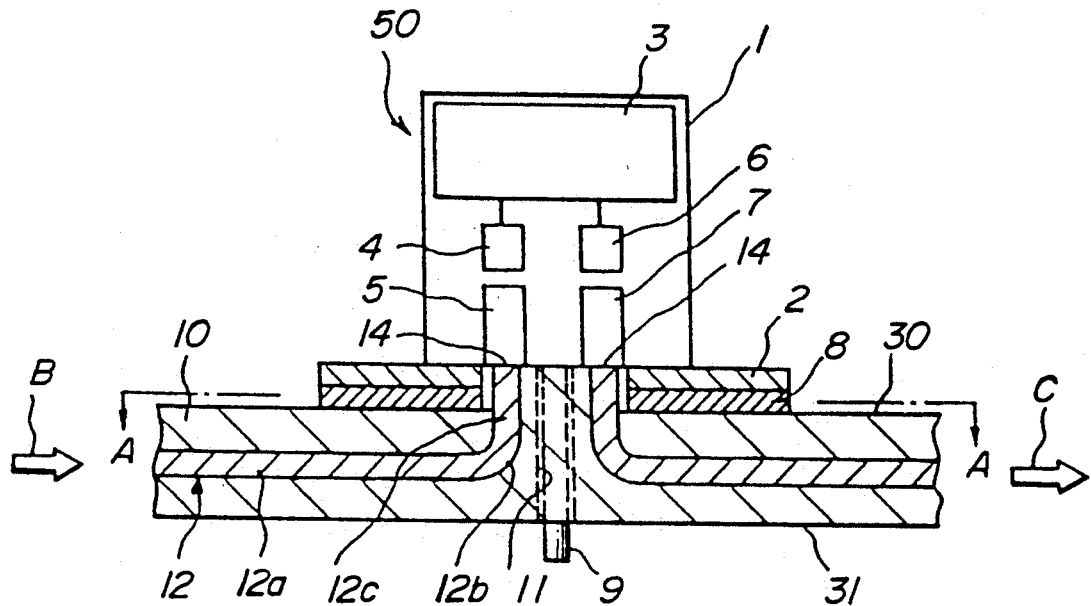
FIGS. 2A, 2B and 2C are a schematic cross-sectional view of a major portion of FIGS. 1A and 1B, respectively.
Figure 2B:
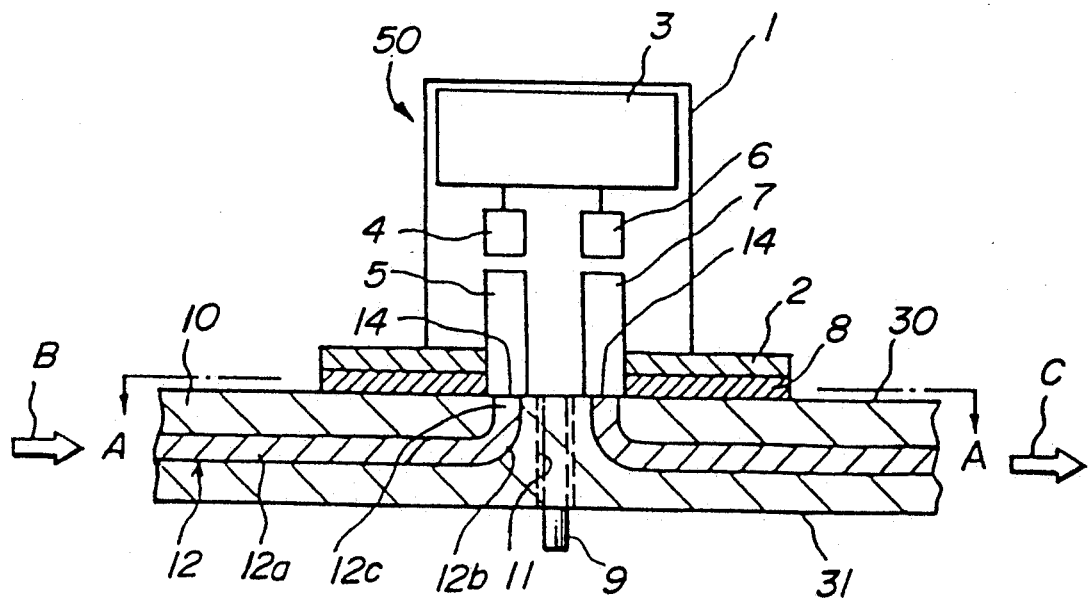
Figure 2C:
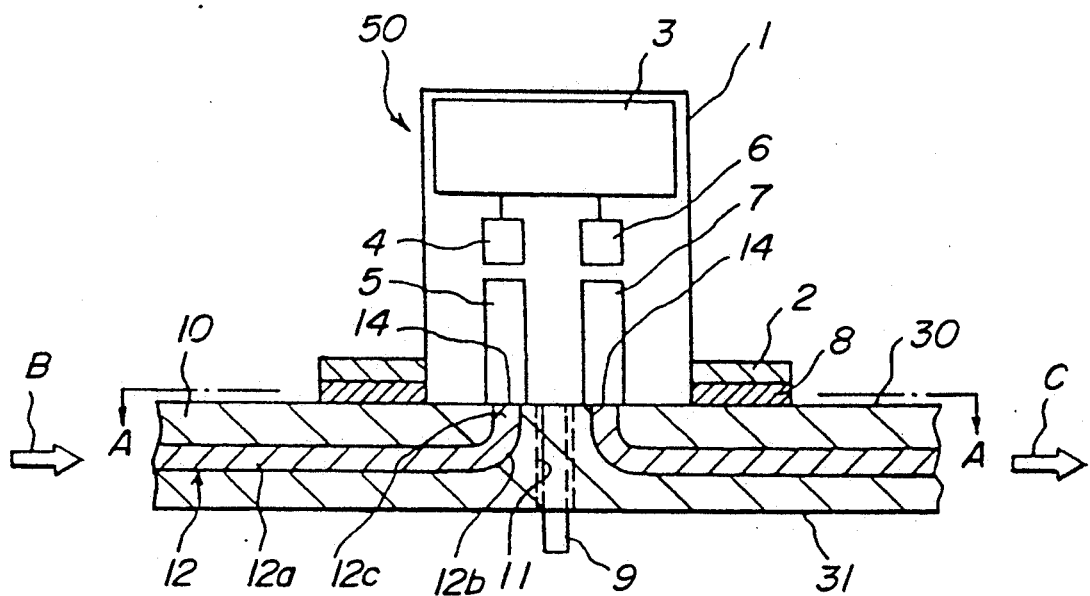

In addition to the structure as shown in FIG. 2A, the connection of the end surfaces of the selfoc micro lenses 5, 7 and the end surfaces 14 of the optical wave guides 12 may also have a structure as shown in FIG. 2B or 2C. In the structure shown in FIG. 2B, the selfoc lenses 5, 7 are fixed on the flange 2 of the OE-SMD 50. In this case, a portion of the end portions 12c of the optical wave guides 12 needs not be protruded from the front surface 30. In this case, the selfoc lenses 5, 7 have a structure of somewhat protruded from the flange 2, so that metallic rings, etc., may be attached on the outer periphery of the selfoc lenses 5, 7, in order to prevent break off of the selfoc lenses 5, 7.

In the structure shown in FIG. 2C, the selfoc lenses 5, 7 are accommodated and fixed in the housing 1 of the OE-SMD 50 in such a fashion that the end surfaces of the lenses have a same level with the bottom surface of the housing 1. In this case, the whole of the bottom surface of the housing 1 including the end surfaces of the selfoc lenses 5, 7 has a structure of somewhat protruded from the flange 2.

Next, operation of the optical surface mounting circuit will be explained. At first, a light beam passing through the optical wave guide 12 as indicated by an arrow B is bent along the bend portion 12b, projected vertically upward from the front surface 30 of the glass substrate 30, passed through the selfoc lens 5, and received by a light beam-receiving element 4 wherein the light beam is once converted into an electric signal. Meanwhile, a desired electric signal is transmitted from the electric input/output terminal 15 to the electric signal processing device 3 to actuate the same, so that the electric signal processing device 3 can treat the electric signal inputted by the light beam-receiving element 4 to a desired extent. The electric signal processing can be conducted according to a known treatment method, and various modifications thereof can be considered and adopted. For example, amplitude, phase or frequency, etc., of the electric signal inputted by the light beam-receiving element 4 can be amplified simply or processed to regenerate an original signal coming through light beam-receiving element 4, or the electric signal from the light beam-receiving element 4 can be extracted to the exterior through the electrical input-/output terminal 15 and subjected to monitoring without any processing of the electric signal. The electrical terminal 15 is also employed for an electric power supply, etc. Such electrical treating device is well known, so that explanations of internal structure thereof are omitted herein.

Subsequently, the electric signal subjected to the desired electric treatment is transmitted to the luminescent element 6 consisting of a semiconductor laser, etc., wherein it is transduced into an optical signal having a desired optical intensity, phase, wave-length and wave form, and then the optical signal is focused by the selfoc lens 7 to be incident in the end portion 12c and coupled to in the optical wave guide 12 as indicated by an arrow C.

According to this embodiment of the optical surface mounting circuit, the pair of guide holes 11 are formed in the glass substrate 10 and the pair of guide holes 11 are fitted to the pair of guide pins 9 to effect the mounting of the OE-SMD 50, and the electric output/input terminal and the optical terminals are connected to the electric wiring and the optical wave guide 12 of the glass substrate 10, respectively. Therefore, different from prior micro- optical devices, the OE-SMD 50 is automatically fixed on the substrate by the fitting of the guide pins 9 to the guide holes 11, so that conventional alignments of optical axes of individual optical parts are not necessary and hence the the man-hours for mounting opto-electronic devices on the substrate board can be extensively reduced.

As the guide pins 9, preferably use is made of columnar studs. The guide holes need not penetrate the glass substrate 10. The guide pins 9 and the guide holes 11 can be varied in number, shape and position, etc. Moreover, the guide pins may be provided on the front side of the glass substrate 10 and the guide holes 11 may be provided on the OE SMD 50 for the fitting thereof to achieve the mounting of the device 50 on the substrate 10.

Precision of the mounting by means of the guide pins 9 and the guide holes 11 can be varied depending on wave-length of the light beam used and purpose of the device. In recent optical communication systems, single mode optical fibers are usually used as optical wave guide for broad area transmission. Today's standard single mode optical fiber has a core diameter of about 10 $\mu$m and a cladding diameter of about 125 $\mu$m. Therefore, various optical devices including semiconductor lasers as a light bream source have to align respective optical axes with a precision of about 1 $\mu$m. Therefore, in order that the devices are usable in a broad zone transmission, the positioning by means of the guide pins 9 and the guide holes 11 has to be effected with a precision of about 1 $\mu$m, and the guide pins 9 may have an outer diameter of, for example, about a few mm.

Moreover, according to this embodiment of the substrate of the optical surface mount circuit, the light beam transmitted in the optical wave guide 12 is projected vertically upward relative to the front surface 30 of the substrate 10 from the end surface 14 of the optical wave guide 12, so that an OE-SMD can be mounted directly or via a desired buffer layer on the front surface 30 to treat the projected light beam with a desired treatment. Similarly, the light beam projected from the OE-SMD mounted on the front surface 30 can be incidented from the end surface 14 in the optical wave guide 12. Therefore, a desired optical circuit can be produced by merely mounting and fixing an OE-SMD on the front surface 30 (front surface 31, as the case may be) of the glass substrate 10, so that the production, mounting, designing and change thereof of the opto-electronic circuit can be facilitated.

In this embodiment, the structure per se of the OE-SMD 50 has a characteristic feature. Namely, the device 50 has in its interior selfoc lenses 5, 7 acting as an optical input/output terminal, a light beam-receiving element, a luminescent element and an electrical treating device (circuit) 3, these parts being individually fixed and aligned in optical axes beforehand. By preliminarily aligning the optical axes of the individual microoptic element and the electric circuit and assembling them in the OE-SMD 50, the alignment of the optical axes thereof in the step of mounting the device 50 on the glass substrate 10 need not be performed newly, so that cumbersome operations of alignment of the optical axes can be dispensed with to further facilitate the mass-production of the optical circuit.

EXAMPLES 2-4

Referring to FIGS. 4-6, other embodiments of the optical surface mounting circuit are shown.

In the optical surface mount circuit shown in FIG. 4, a total of four columns of optical wave guide 12 are formed in the interior of the glass substrate 10, and the end surfaces of the optical wave guides 12 exposed on the front surface 30 of the optical wave guides 12 are connected to the light beam-receiving element or the luminescent element in the OE-SMD for the purpose of switching the optical wave guides 12. For example, if the pair of optical wave guides 12 at the left side in FIG. 4 are connected to the light beam-receiving elements (input side) and the pair of optical wave guides 12 at the right side in FIG. 4 are connected to the luminescent elements (output side), switching between the optical wave guides can be performed by switching electrical connections between the luminescent elements and the light beam-receiving elements in the electrical treating device.

Figure 5A:
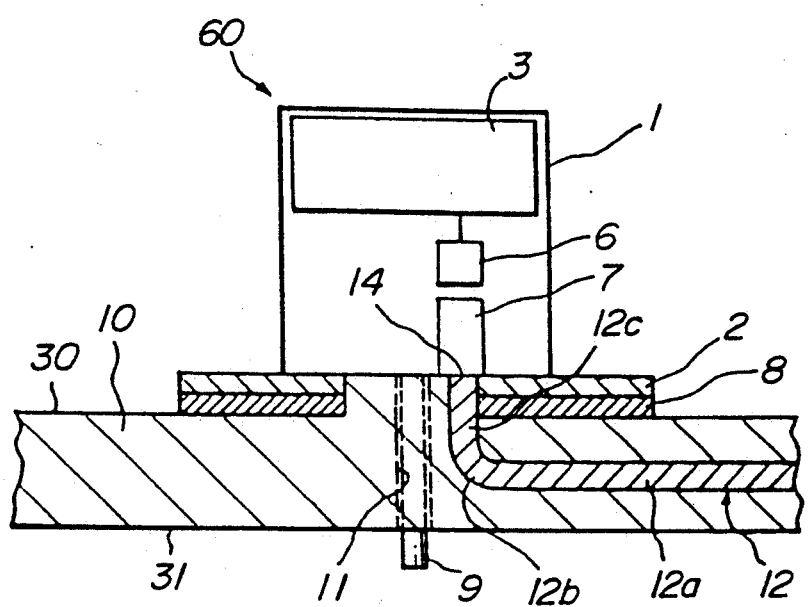
Figure 5B:
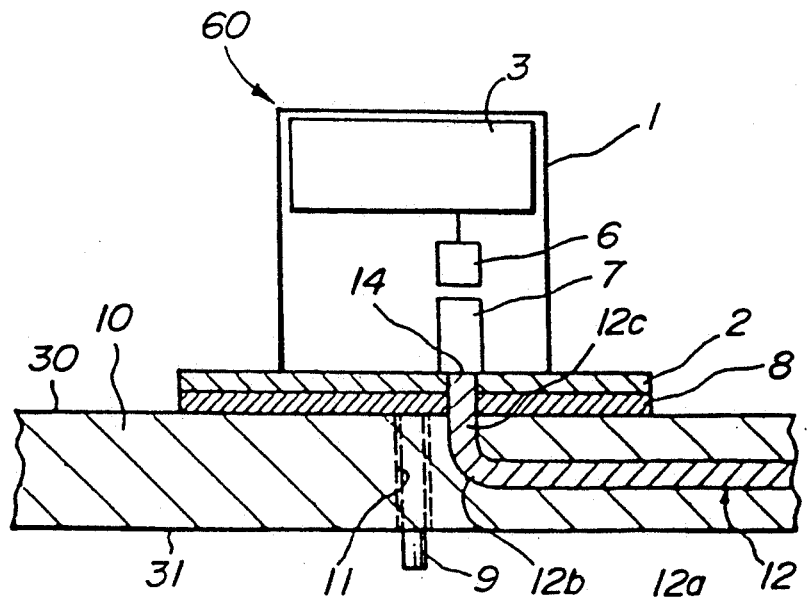
Figure 5C:
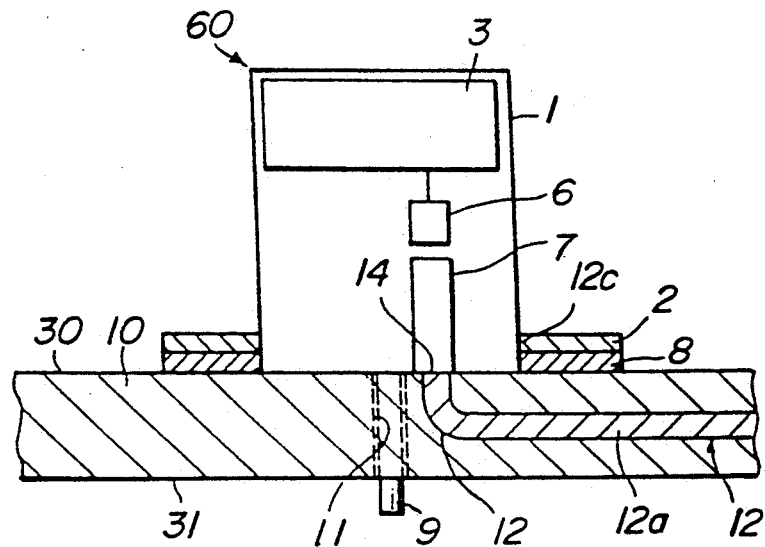

In the embodiment shown in FIGS. 5A, 5B and 5C, the input side of an OE-SMD 60 is omitted and the output side of the device 60 is solely built in the device 60. Therefore, a desired electric signal is transmitted to the electrical treating device 3 to control the same, and the luminescent element 6 is actuated by an electric signal from the electrical treating device 3 to supply an optical signal of a desired wave form, wave-length, phase and intensity through the selfoc lens 7 and the optical wave guide 12. Of course, vice versa to the embodiment of FIGS. 5A, 5B and 5C, an OE-SMD having solely a built-in light beam-receiving element can be used to detect the optical signal transmitted through an optical circuit at the light beam-receiving element and transduce it into an electric signal for transferring to the exterior.

Figure 6A:
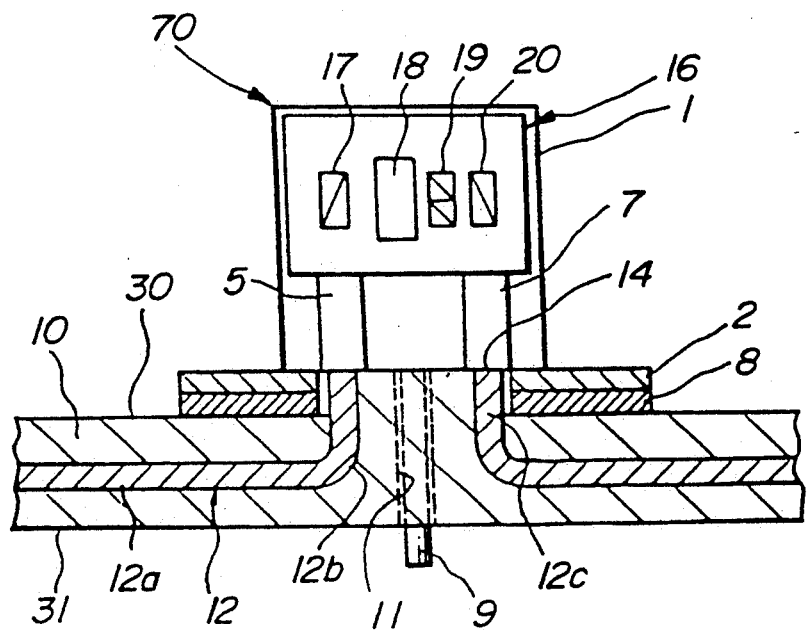
Figure 6B:
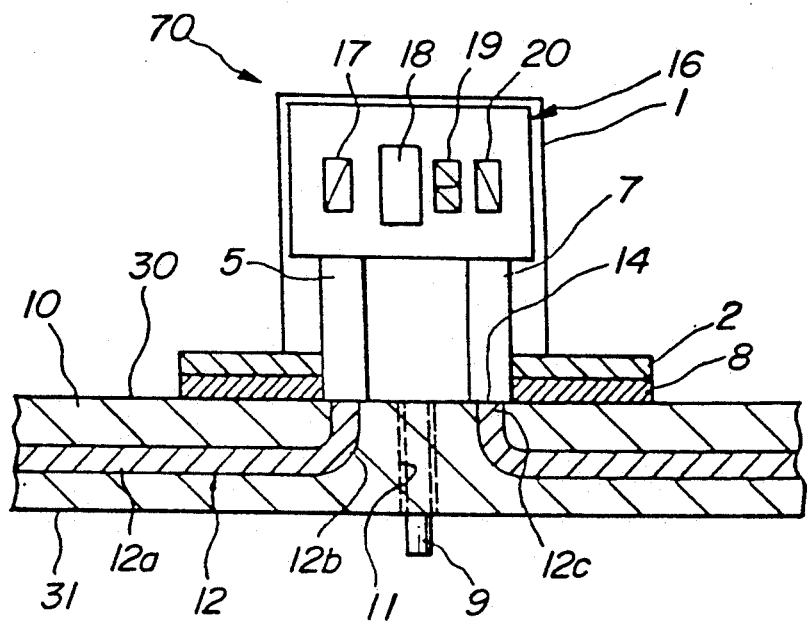
Figure 6C:
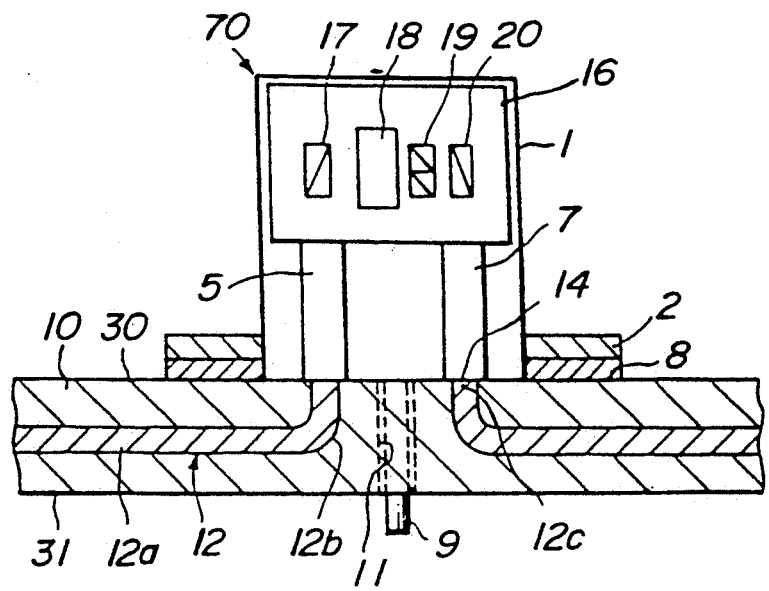

In the embodiment shown in FIGS. 6A, 6B and 6C, the electrical treating device is not provided in an OE-SMD 70, and an optical isolator device 16, which is an optical treating device, is solely built in the device 70, in order to interrupt reflected light beams emanated from the connected point of the optical fibers in the light beam transmitting path and from the outlet end of the optical fiber of the connection system when using a semiconductor laser and to obtain a stable oscillating property. The inventor has formerly proposed in Japanese Patent publication No. 52-64315 a polarization-independent optical isolator (Japanese Patent No. 1335915). Explaining more concretely, the isolator device 16 accommodates therein two birefringent prisms like Rochon type 17 and 19, a Faraday's element 18, and a mirror 20 if necessary, and optical axes of the optical parts of the isolator device 16 are aligned beforehand at the time of preparing the OE-SMD 70. Of course, structural elements or parts of the isolator device 16 can be varied in various fashions. Instead of the isolator device 16, the device 70 can accommodate therein an optical filter, an OEIC, and lens, etc., for example.

EXAMPLES 5-6

Figure 7:
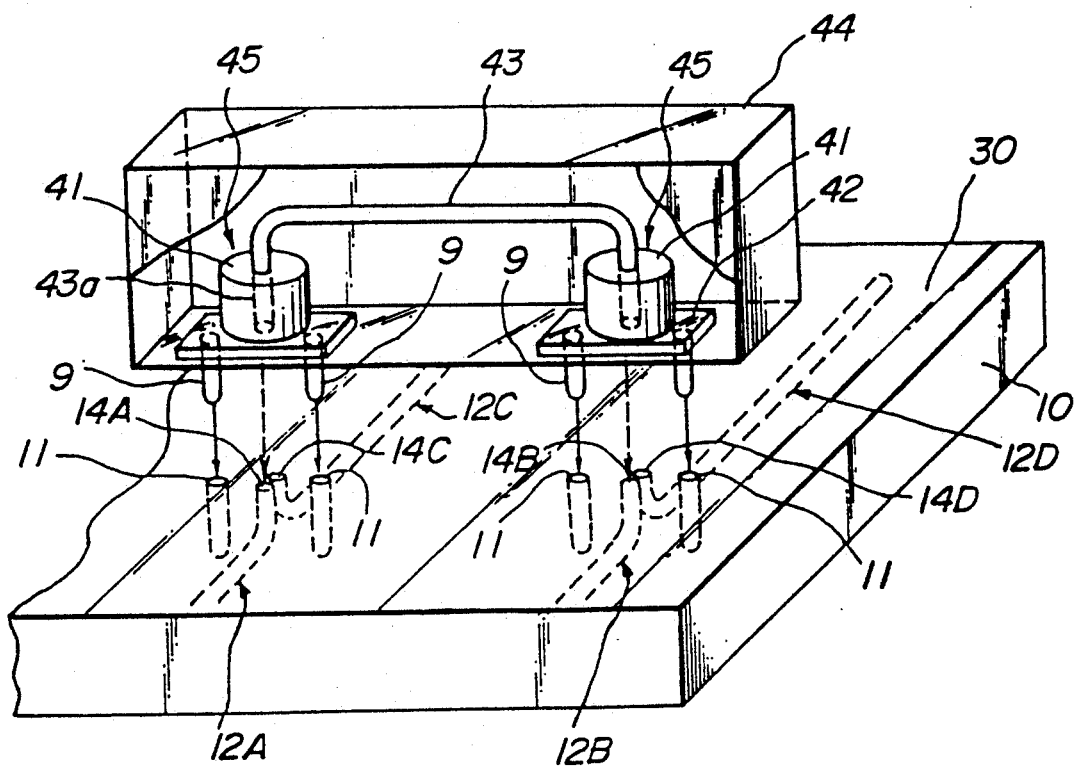
FIG. 7 is a schematic perspective view of a state of mounting a plug which connects optical wave guides by an optical fiber on a substrate.
Figure 8:
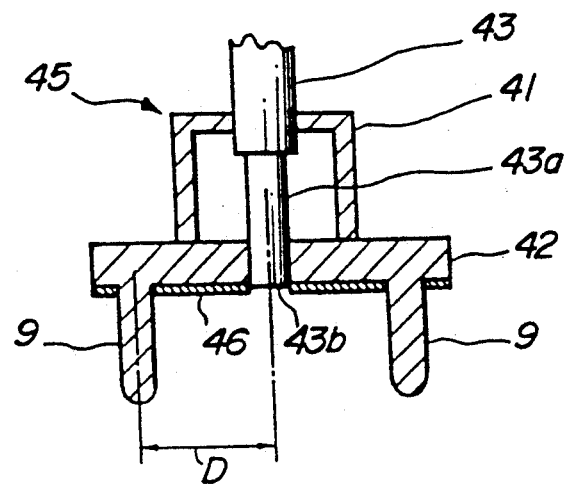
FIG. 8 is a schematic cross-sectional view of a precise metallic fitting having a built-in plug of FIG. 7.

Referring to FIGS. 7 and 8, a plug 44 for connecting the optical wave guides by means of an optical fiber is illustrated as if it is transparent, in order to show the interior thereof.

A total of four columns of optical wave guides 12A, 12B, 12C and 12D are formed in the interior of the glass substrate 10, and the end surfaces 14A, 14B, 14C and 14D of all the optical wave guides are exposed on the front surface 30 of the glass substrate 10. A pair of guide holes 11 are bored around neighboring end surfaces 14A, 14C, and similarly a pair of guide holes 11 are bored around neighboring end surfaces 14B, 14D. The plug 44 is made of a soft flexible material, such as resin, etc., and houses therein a pair of precise metallic fitting 45 which consists of a columnar portion 41 and a flange portion 42. The flange portion 42 is provided with a pair of guide pins 9 at the bottom surface thereof. The pair of precise metallic fittings 45 are connected to each other by an optical fiber 43, the end surfaces of the optical fiber 43 being fixed in the precise metallic fitting 45, and end surfaces 43b of the core 43a of the optical fiber 43 is exposed on the bottom surface of the precise metallic fitting 45.

When mounting the plug 44 on the glass substrate 10, the guide pins 9 are fitted to the corresponding guide holes 11. In the drawings, the reference numeral 46 is a cushion rubber. In this case, the end surfaces 43b of the optical fiber is connected to the end surfaces 14A, 14B of the optical wave guides 12A, 12B at the end surfaces, so that high precision of size is required for a distance between the central axis of the core 43a of the optical fiber 43 and the central axis of the guide pin 9. The precise metallic fitting 45 is used to meet the requirement. The reason of making the plug 44 of a soft flexible material is to cope with a tiny deviation of the distance between the optical wave guides 12A and 12B or 12C and 12D.

In this way, according to this embodiment, the optical wave guides 12A and 12B can easily be connected to each other by the mounting of the plug 44, while attaining the similar effects as those of the embodiment of FIG. 1. Alternatively, of course, the optical wave guides 12A and 12D can be connected to each other, the optical wave guides 12B and 12C can be connected to each other, or the optical wave guides 12A and 12D can be connected to each other simultaneously with the connection of the optical wave guides 12B and 12C.

EXAMPLE 7

Figure 9:
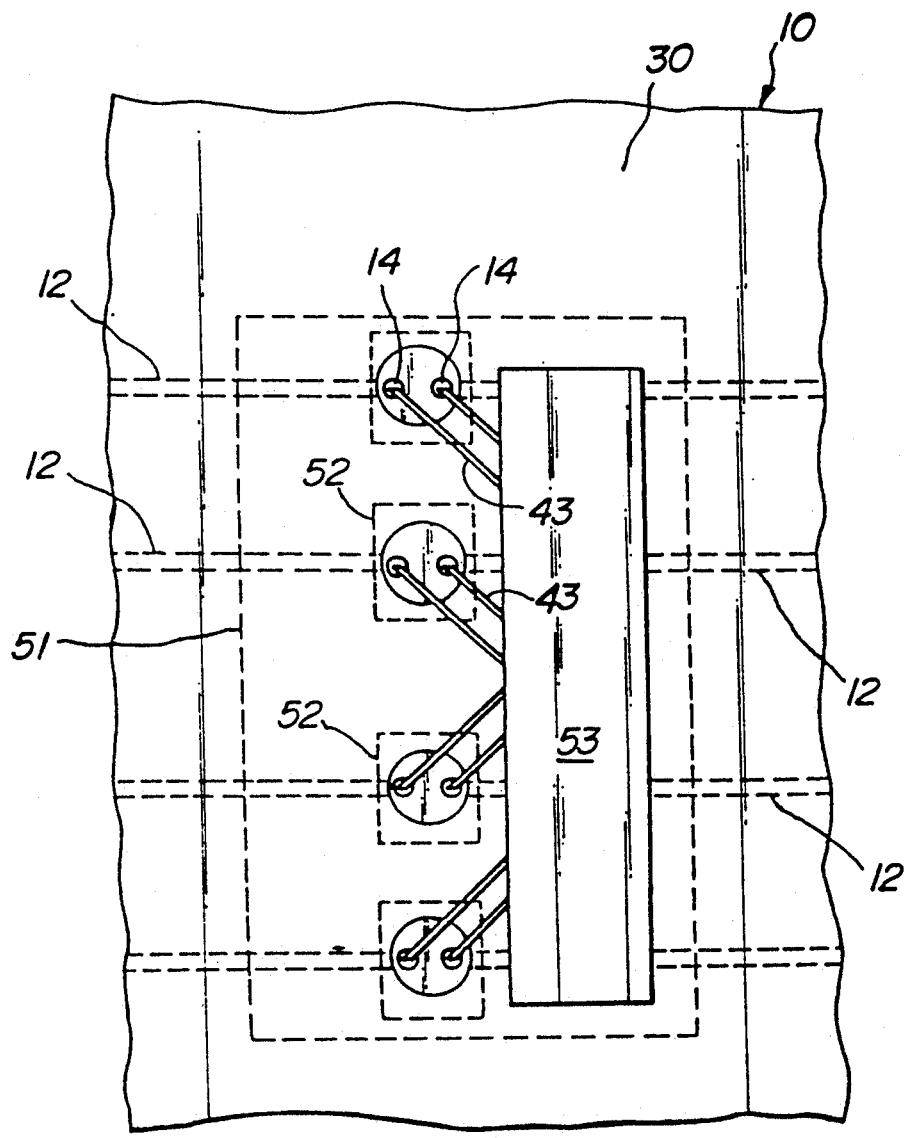
FIG. 9 is a schematic plan view of plug such as mixing rod or wavelength multiplexer/demultiplexer plug.

Referring to FIG. 9, a mixing plug 51 is schematically shown.

As a whole, the mixing plug 51 is made of a soft flexible material and has a similar structure to the plug 44 of FIG. 7 and accommodates therein four precise metallic fittings 52 and a mixing rod 53. A total of eight columns of optical wave guides 12 are formed in the interior of the glass substrate 10, and the end surfaces 14 of the optical wave guides 12 are exposed on the front surface of the glass substrate 10. Each two optical fibers 43 are fixed on each precise metallic fitting 52, the end surfaces of the optical fibers 43 are connected to the end surfaces 14 of the optical wave guides 12 at the end surfaces, and the other end surfaces of the optical fibers 43 are connected to the mixing plug 51. In the mixing plug 51, an input optical signal is split into plural optical signals.

The mixing plug 51 can also be used as a wavelength multiplexer/demultiplexer plug. In this case, the other end surfaces of the optical fibers 43 may be connected to a light beam wavelength multiplexer/demultiplexer, etc., to mix plural light beam signals of different wavelengths or to branch a light bream signal of mixed wavelengths into plural the embodiments of FIGS. 1A-5 and 22, the light beam signals of respective wave-length at the receiving side of the mixing plug 51.

EXAMPLE 8

Referring to FIGS. 10A, 10B, 10C and 10D, sequential steps of a process of forming an optical wave guide in a glass substrate and exposing the end surface of the optical wave guide to the front surface of the substrate are shown.

Figure 10A:
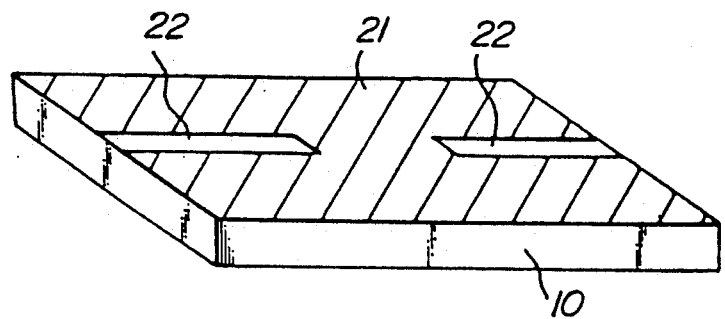
FIGS. 10A, 10B, 10C and 10D are schematic perspective views showing sequential process steps of forming an optical wave guide on a glass substrate.

At first, a glass plate or substrate 10 containing at least two types of modified oxides and having a uniform refraction is prepared. On the front surface of the glass plate 10 is formed a first mask 21 of a desired pattern consisting of, e.g., paraffin or a mask for photoetching to yield a state as shown in FIG. 10A.

Figure 10B:
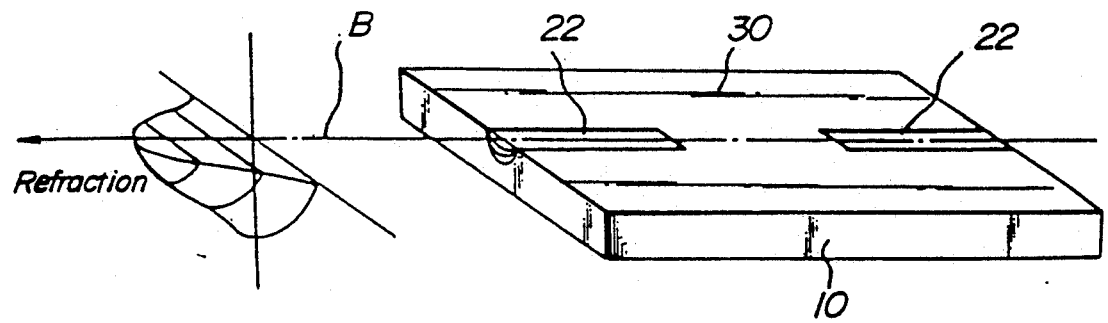

Next, a solution of a salt of metallic cation (such as $Ti^+$, etc.) having a larger ion polarization per unit volume as compared with those of metallic cations (such as $K^+$, $Na^+$, etc.) contained in the glass substrate 10 is contacted with the front surface of the glass substrate 10 via the first mask 21 to effect ion exchange thereof and diffuse $Ti^+$, etc., into the front surface 30, and then the first mask 21 is removed from the front surface of the glass substrate 10. By this treatment, ion exchange is effected from exposed portions 22 of the front surface not coated by the first mask 21, while forming a zone of refraction gradient in the substrate 10 wherein the refraction is gradually decreased from the surface of the exposed portions 22 towards the interior thereof, as shown in FIG. 10B.

In this case, as the modified oxides, $Li_2O$, $Na_2O$, $K_2O$, $Rb_2O_3$, $Cs_2O$, $Tl_2O$, $Au_2O$, $Ag_2O$, $Ca_2O$, $MgO$, $CaO$, $BaO$, $ZnO$, $CdO$, $PbO$, $SnO_2$ and $La_2O_3$ may be selectively used.

The principle of forming a refraction gradient is described in detail in the applicant's Japanese Patent Publication No. 48-5,975. Therefore, detailed explanations thereof are omitted herein, and the descriptions of Japanese Patent Publication No. 48-5,975 are incorporated herein by reference.

Figure 10C:
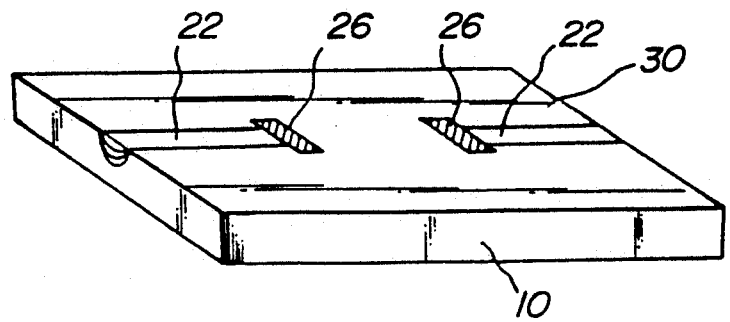

Next, end portions of the exposed portions 22 of the front surface at the central side of the glass substrate 10 are coated with a second mask 26, as shown in FIG. 10C.

Figure 10D:
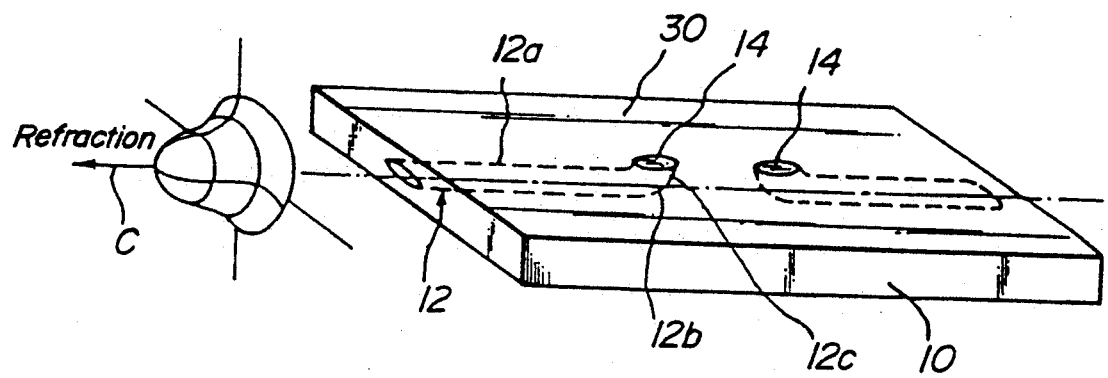

Then, a solution of a salt of metallic cation (such as $K^+$, or $Na^+$, etc.) having a smaller ion polarization per unit volume as compared with that of diffused ions ($Ti^+$, etc.) used in the first ion exchange step is contacted with the front surface 30 of the glass substrate 10. By this treatment, a zone of refraction gradient is formed in the substrate 10 wherein the refraction is gradually increased from the exposed surface not coated by the second mask 26 and contacted with the salt towards the interior of the substrate 10. In the areas of the exposed portions 22 as shown in FIG. 10C, zones of refraction gradients are formed wherein the refractions are gradually decreased from the central high refraction area towards the surrounding area thereof, as shown in FIG. 10D.

In the meantime, the areas coated by the second mask 26 do not effect the above second ion exchange, so that high refraction areas as shown in FIG. 10B remain as they are. As a result, when the second mask 26 is removed therefrom, end portions 12c and the end surfaces 14 exposed to the front surface 30 are formed, as shown in FIG. 10D.

In this way, optical wave guides 12 having a desired pattern and end surfaces 14 exposed to the front surface of the glass substrate 10 can be formed. The optical wave guides 12 functions as a medium of transmitting a light beam, because they have zones of refraction gradient wherein the refraction is gradually decreased from the central axis towards the surrounding portion thereof, as mentioned above.

The radius of curvature at the bend portion 12b should preferably be about a few mm when the diameter of the optical wave guide 12 is 10 μm. Variation rate Δn/n of variation Δn of the refraction in the optical wave guide 12 to the refraction n in the surrounding portion of the optical wave guide 12 should preferably be about 0.1- a few %.

Figure 11:
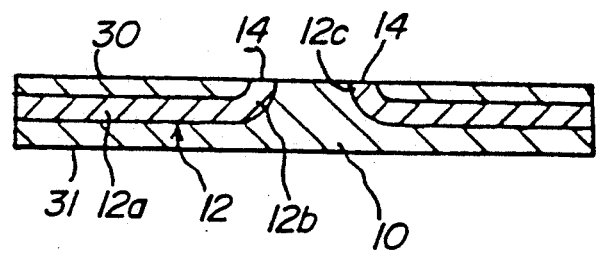
FIG. 11 is a schematic cross-sectional view of FIG. 10D.

In order to protrude a portion of the end portion 12C of the optical wave guide 12 from the front surface 30 as shown in FIG. 2A, a method may be effected, e.g., of grinding the front surface 30 to some extent from the state of FIG. 11. The end portion 12c may be connected directly to the selfoc lens 5 without effecting the grinding, as shown in FIG. 2B.

In the above embodiments, explanations have been made taking a glass substrate as a plate-shaped transparent dielectric body, however, generally synthetic resins can also be used as a plate-shaped transparent dielectric body.

For example, Japanese Patent Publication No. 47-26,913 proposed to use synthetic resins for an optical wave guide having a characteristic property of refraction of gradually varying from the central axis towards the surrounding portion. That is, according to Japanese Patent Publication No. 47-26,913, a synthetic resin substrate having cross-linkings by ion bondage of carboxylic groups and metallic ions is contacted with ions of an other metal, and the metallic ions in the synthetic resin near the contacted surface are substituted by the other metal ions in such a fashion that concentration ratio of at least two metallic ions contained in the synthetic resin substrate is varied from the center towards the surface of the synthetic resin substrate, whereby the refraction can be varied from the center toward the surface of the substrate.

As the metallic ions, desirably ions of monovalent metal are used, though ions of any metal can be used.

Meanwhile, in case when the metallic ions diffused in the synthetic resin substrate by the ion exchange have a larger ion polarization per unit volume than that of the metallic ions contained beforehand in the synthetic resin substrate, the refraction in the substrate is decreased from the front surface towards the interior of the substrate. In contrast, in case when the metallic ions contained beforehand in the synthetic resin substrate have a larger ion polarization per unit volume than that of the metallic ions diffused in the synthetic resin substrate by the ion exchange, the refraction in the synthetic resin substrate is decreased from the interior towards the front surface of the synthetic resin substrate.

This phenomenon clearly brings about the same results as those of the ion exchange in the glass substrate shown in the above embodiments.

Therefore, a synthetic resin substrate is used instead of the glass substrate in the above embodiments and the first and second ion exchange treatments are effected according to a sequence of process steps as shown in FIGS. 10A-10D to obtain a resin substrate as shown in FIG. 10D and 11.

In addition to the method of preparing an optical wave guide in a synthetic resin substrate by ion exchange method, other methods can also be adopted. For example, a groove or a hollow guide is formed in a polycarbonate resin substrate, and a liquid ultraviolet ray-curable resin is filled in the groove and cured by an ultraviolet ray to form an optical wave guide having a large refraction.

EXAMPLE 9

Connection of the wiring on the front surface 30 of the substrate 10 to the wiring in the OE-SMD 50 may also be effected as follows.

Figure 12:
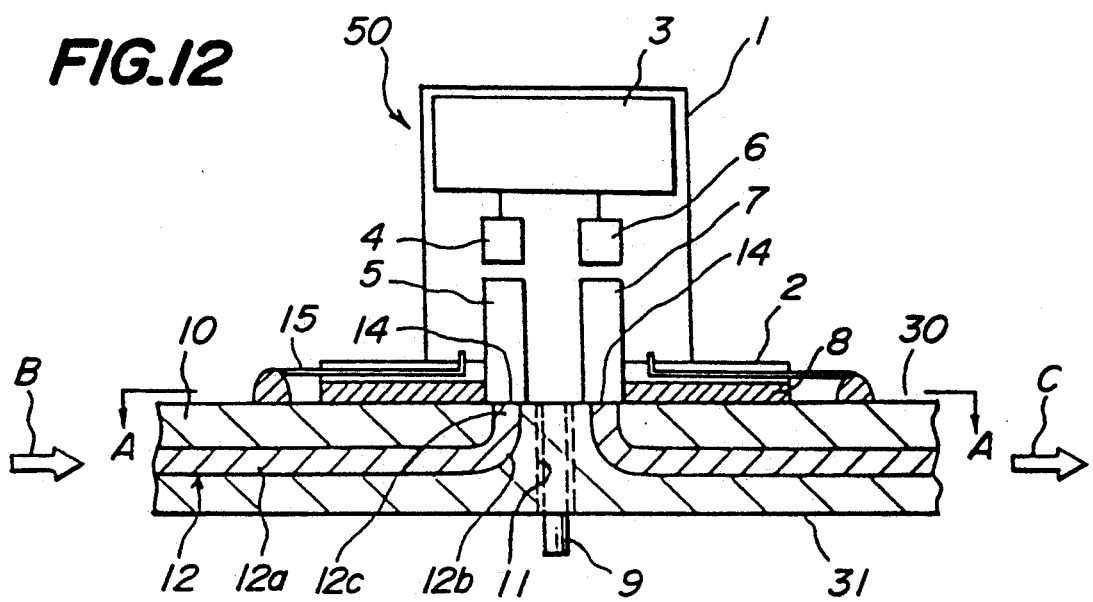
FIG. 12 is a schematic cross-sectional view of another embodiment of the OE-SMD showing the structure thereof.
Figure 13:
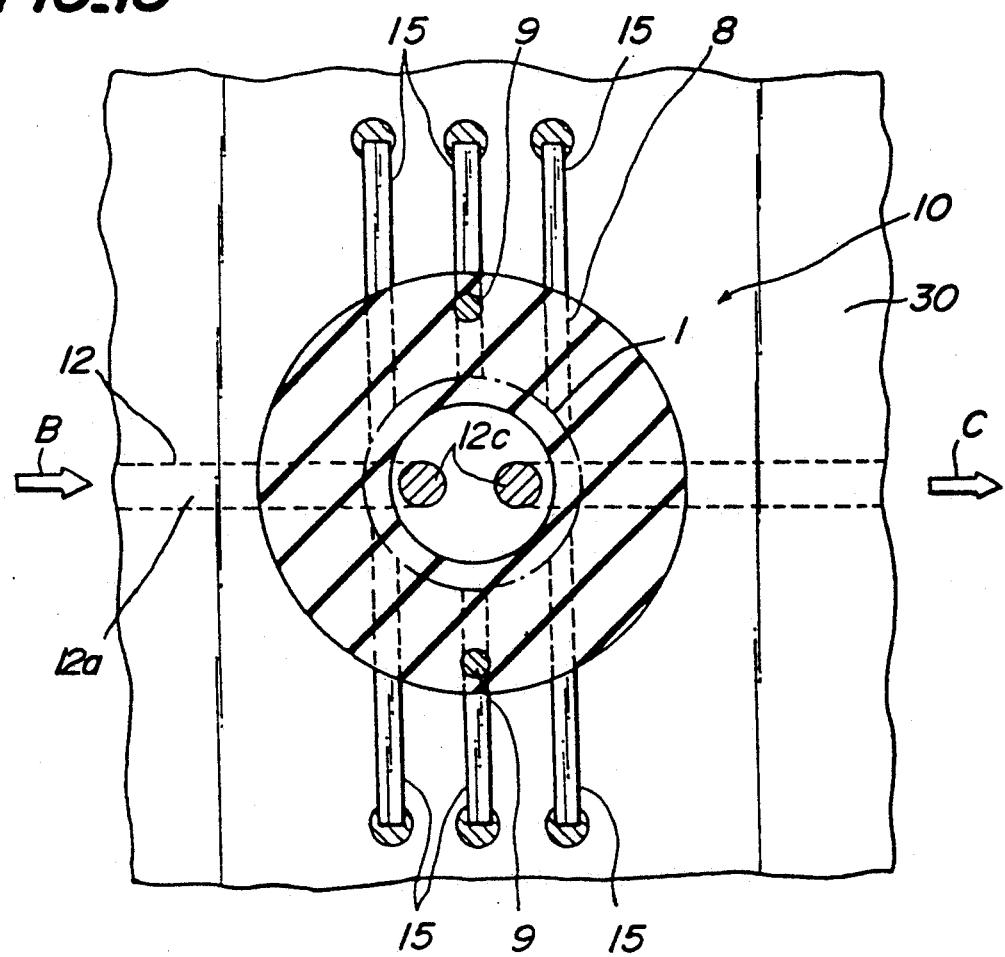
FIG. 13 is a schematic cross-sectional view thereof taken along the line A—A of FIG. 12.

Referring to FIGS. 12 and 13, connections of the device 50 to the substrate 10 is shown. In this structure, six electrical input/output terminals 15 are protruded from the OE SMD 50 to the exterior and connected to the printed electric wiring on the front surface 30 of the substrate 10 by soldering. Electrical input/output terminals 15 arranged in the housing 1 are connected to a light beam receiving element 4, a luminescent element 6 or an electric circuit part 3.

EXAMPLE 10

Figure 14:
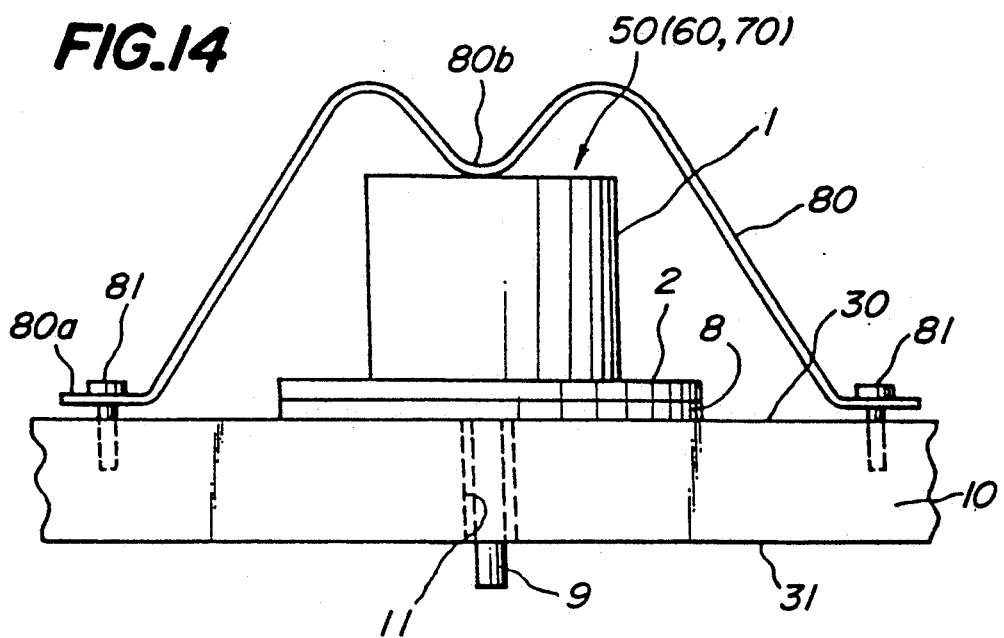
FIG. 14 is a schematic front view of a mounted state of another embodiment of the OE-SMD.
Figure 15:
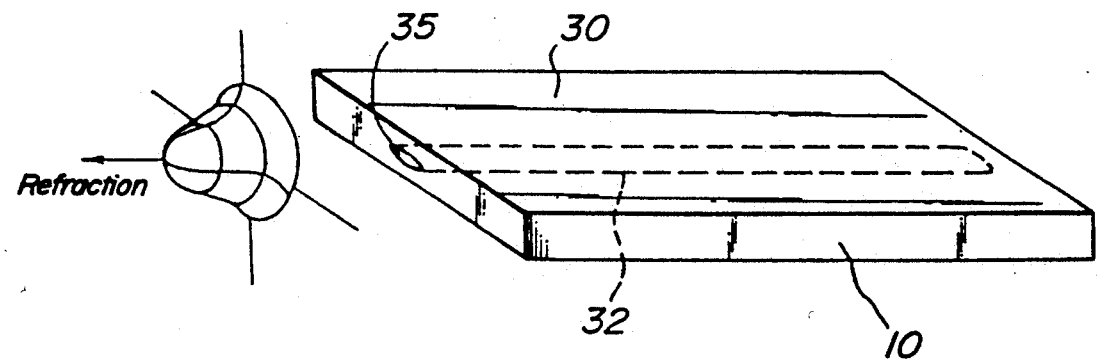
FIG. 15 is a schematic perspective view of a conventional glass substrate having an optical wave guide formed therein.
Figure 16:
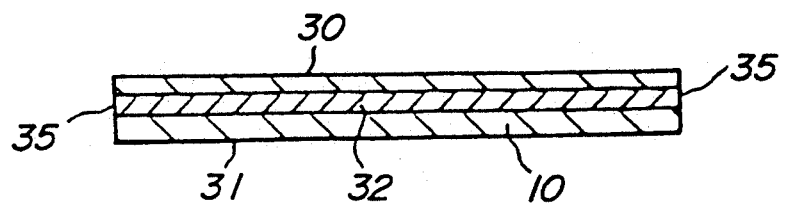
FIG. 16 is a schematic cross-sectional view thereof.

Referring to FIG. 14, another mode of connecting the OE-SMD 50 (60 or 70) to the glass substrate 10 is shown. Interiors of the devices and structure of the optical wave guide in the interior of the glass substrate 10 are the same as those of FIG. 1, so that detailed explanations thereof are omitted.

In this embodiment, a mountain-shaped leaf spring 80 having a central recessed pressing portion 80b is fixed on the glass substrate 10 by studs 81a at the flanges 80a of the leaf spring 80, while pressing the housing 1 from the upward by the pressing portion 80b to fix the optical device 50 (60 or 70). The pressing power of the pressing portion 80b may be adjusted by the studs 81a. In this embodiment, the optical device 50 (60 or 70) is more assuredly prevented from disengagement from the glass substrate 10.

In the abovementioned embodiments shown in FIGS. 1A-9, the guide pins 9 may have threaded portions at their heads, and the threaded portions of the guide pins 9 may be protruded from the front surface 31 and threadedly engaged and fixed with nuts or the like fixing element to press the device 50 (60 or 70) to the glass substrate 10.

The above embodiments can be modified in various ways.

In the embodiments shown in FIGS. 1A-14, the rubber cushion 8 may be made of a rubber or the like resilient material, or metal instead of rubber.

An OE-SMD involving optical part or device, such as an optical integrated circuit part or an optical electron integrated circuit (OEIC) can be mounted on the substrate of the present invention. The latter is a usual integrated circuit having a semiconductor substrate on which bipolar transistors and MOS FET are integrated and further an optical device, such as laser or photodiode, etc., integrated on the same substrate.

Figure 1B:
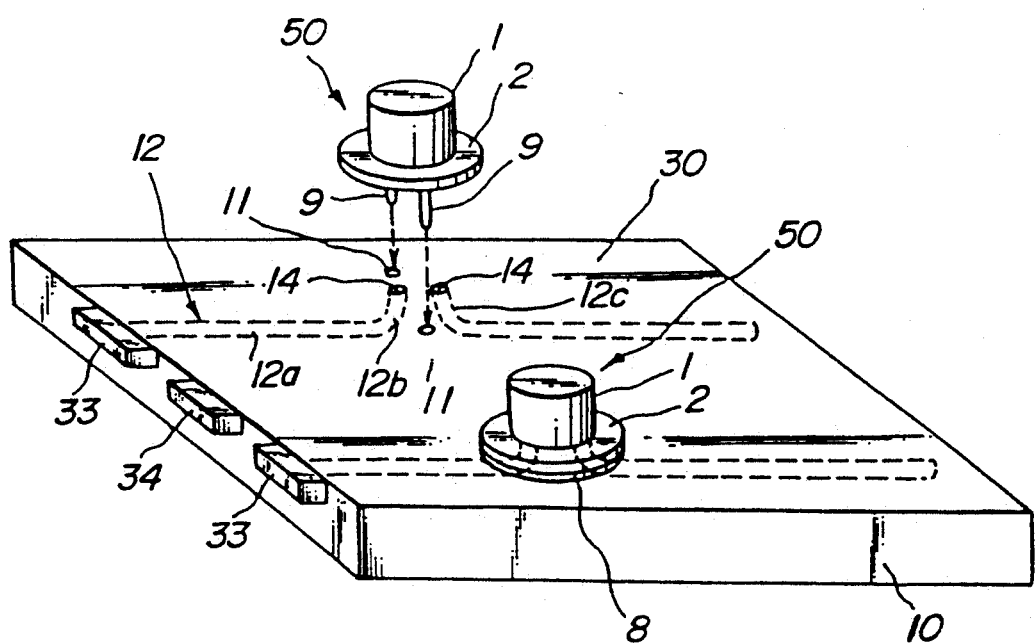

Though in the embodiment of FIGS. 1A and 1B the glass substrate 10 was explained as having a printed electric wiring thereon or therein, the wiring is not always necessary, so that only an optical part not having an electric circuit can be mounted on the glass plate 10. In such a case, of course the optical part need not have an electrical terminal.

EXAMPLE 11

Referring to FIGS. 17-19, process steps of forming an optical wave guide using a semiconductor substrate are shown.

At first, a Si layer 63 is formed on an insulative substrate 64, and a desired etching treatment is effected on the Si layer 63 to form a slant surface 63a of a gradient of 45°. Next, a buffer layer 62 is formed on the Si layer 63, and a SiO2 layer doped with TiO2 or a Si3N4 layer 61 is formed on the buffer layer 62 to yield a state as shown in FIG. 17.

Then, the SiO2 layer doped with TiO2 or the Si3N4 layer 61 is subjected to an etching treatment to form an optical wave guide 65 having a straight portion 65a and an end portion 65c which is vertical to the front surface of the substrate, as shown in FIG. 18. Subsequently, a cladding layer 66 is formed on the Si layer and the optical wave guide 65 to prepare a substrate for an optical surface mount circuit.

When the optical wave guide 65 is made from Si3N4 (refraction n=1.97), the cladding layer 66 is made from SiO2 (n=1.42), as disclosed in Journal of Lightwave Technology, October 1989, p 1533. In the optical wave guide 65, the refraction is uniform, so that a light bream transmitted in the straight portion 65a is reflected at a mirror portion 65b and projected from an end surface 65d through the end portion 65c. Therefore, the substrate can be used as a substrate for an optical surface mount circuit similarly as the embodiments of FIGS. 1A-3. The mode of using the substrate is similar to that of the glass substrate, so that detailed explanations thereof are omitted herein.

Also, a method of forming both the optical wave guide 65 and the cladding layer 66 from SiO2 doped with TiO2, is described in Journal of Lightwave Technology, June 1988, p 1003. In such a case, the content of TiO2 in the cladding layer 66 is made small, while the content of TiO2 in the optical wave guide 65 is made relatively large, so that the refraction in the optical wave guide 65 is a little larger than the refraction in the cladding layer 66. The difference between the refractions in the optical wave guide 65 and the cladding layer 66 is preferably 0.1- a few %, more preferably 0.1-1%.

In this embodiment, the refraction in the optical wave guide 65 can be made uniform, or a zone of refraction gradient can be formed in the optical wave guide 65 wherein the refraction is gradually decreased from the central axis thereof towards the surrounding portion, depending on production methods as already described above.

EXAMPLE 12

Referring to FIGS. 20A-20E, process steps of preparing an optical wave guide using a semiconductor PWB substrate are shown.

Figure 20A:
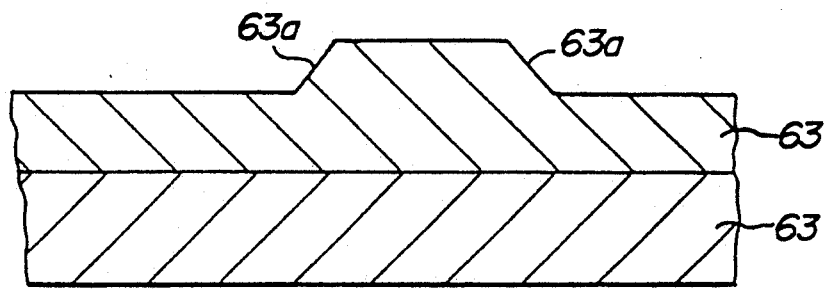
FIG. 20A, 20B, 20C, 20D and 20E are schematic cross-sectional views of another embodiment of sequential process steps of forming an optical wave guide a semiconductor PWB substrate.

A Si layer 63 is formed on an insulative substrate 64, and a desired etching treatment is effected on the Si layer 63 to form a slant surface 63a of a gradient of 45°, as shown in FIG. 20A. In this case, a reactive ion beam etching is advantageously used, for it can form a slant surface of an arbitrary gradient by merely changing the angle of the ion beam.

Figure 20B:
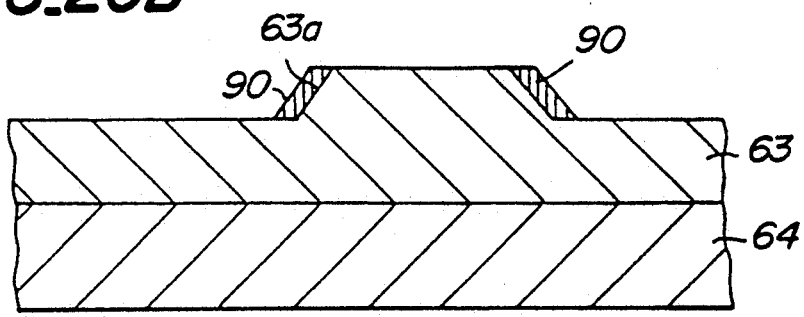
Figure 20C:
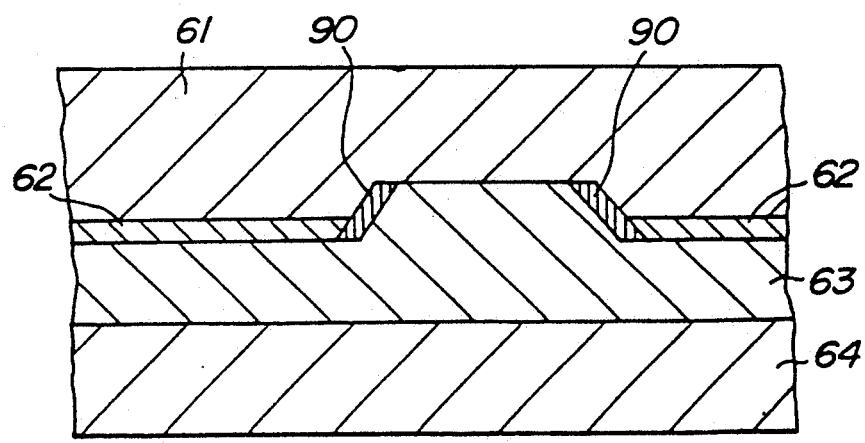

Next, a light beam reflecting layer 90 is formed on the Si layer 63. The light beam reflecting layer 90 is a thin film or membrane of metal, such as gold, or aluminum, etc., or multi layered reflecting film of dielectric bodies, and may be provided by a suitable means, such as vapor deposition, sputtering, etc. Then, the light beam reflecting layer 90 is removed by etching to leave a part thereof neighboring the slant surface 63a, as shown in FIG. 20B. Subsequently, a buffer layer 62 is provided on the light beam reflecting film 90 and the Si layer 63, and a layer of SiO2 doped with TiO2 or a Si3N4 layer 61 is deposited on the buffer layer 62 to yield a state as shown in FIG. 20C.

Figure 20D:
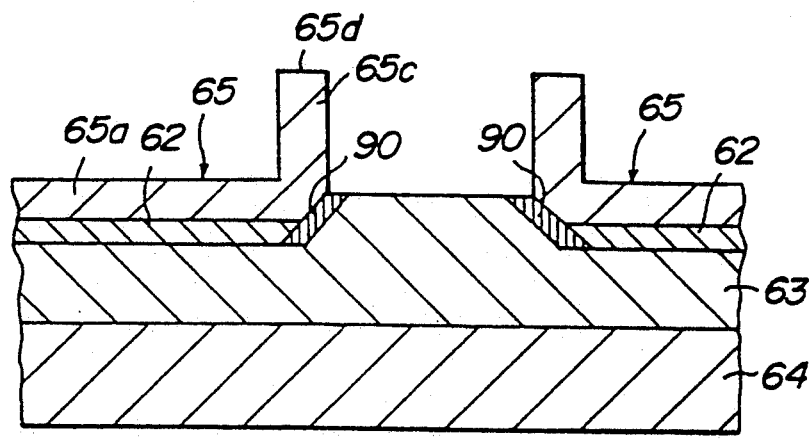
Figure 20E:
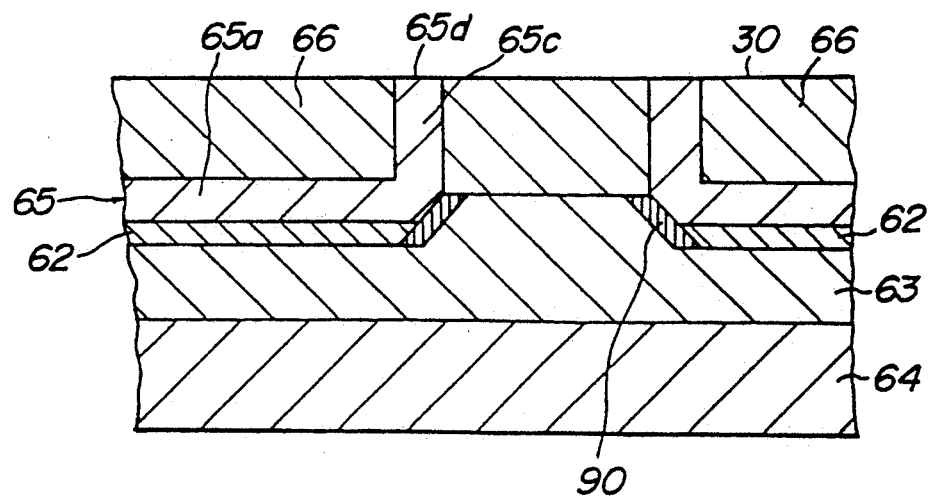

Then, the layer of SiO2 doped with TiO2 or the Si3N4 layer 61 is etched to form an optical wave guide 65 having a straight portion 65a and an end portion 65c which is vertical to the front surface of the substrate, as shown in FIG. 20D. Thereafter, a cladding layer 66 is formed on the optical wave guide 65 as shown in FIG. 20E to prepare a substrate for an optical surface mount circuit.

This substrate can be used in the same mode as that of the substrate of FIG. 19. In addition, the bend portion between the straight portion 65a and the end portion 65c has a light beam reflecting film 90 adjacent thereto, so that a light beam transmitted in the straight portion 65a is completely reflected by the light beam reflecting film 90 and projected from the end surface 65d of the optical wave guide 65. Therefore, scattering of the light beam which occasionally produced at the time of reflection of the light beam can be prevented as well as a loss of optical information which is caused by partial permeation of the light beam, so that the signal transmitting efficiency can further be improved.

EXAMPLE 13

Figure 21:
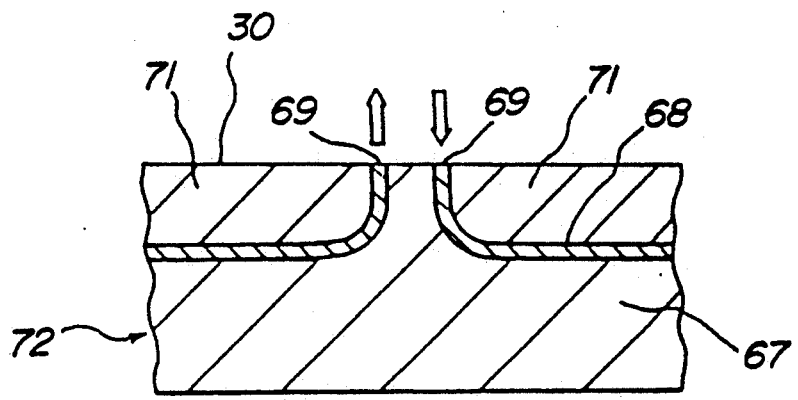
FIG. 21 is a schematic cross-sectional view of a resin substrate wherein an optical fiber is embedded therein.

Referring to FIG. 21, an embodiment is shown of preparing a substrate of the present invention using a single mode optical fiber In this embodiment, single mode optical fibers are embedded in a substrate made of resin, such as polyimide, etc. Explaining concretely, a resin is formed to a base plate 67 on which optical fibers 68 are positioned, and end surfaces 69 of the optical fibers 68 are made to stand upright as shown in the drawing. Then, a resin material is cast on the optical fibers 68 on the substrate 67 to form a surface layer 71 thereby to embed and fix the optical fibers 68 therein At this state, end surfaces 69 of the optical fibers 68 are exposed on the front surface 30 of the resin substrate 72, so that optical signal input-/output can be reflected vertically to the front surface 30, as indicated by arrows. Thereafter, the resin substrate 72 can be used to an optical surface mounting circuit as shown in FIG. 1A-3, for example.

This embodiment can be modified in various modes, such as those described in Example 10.

EXAMPLE 14

Figure 22:
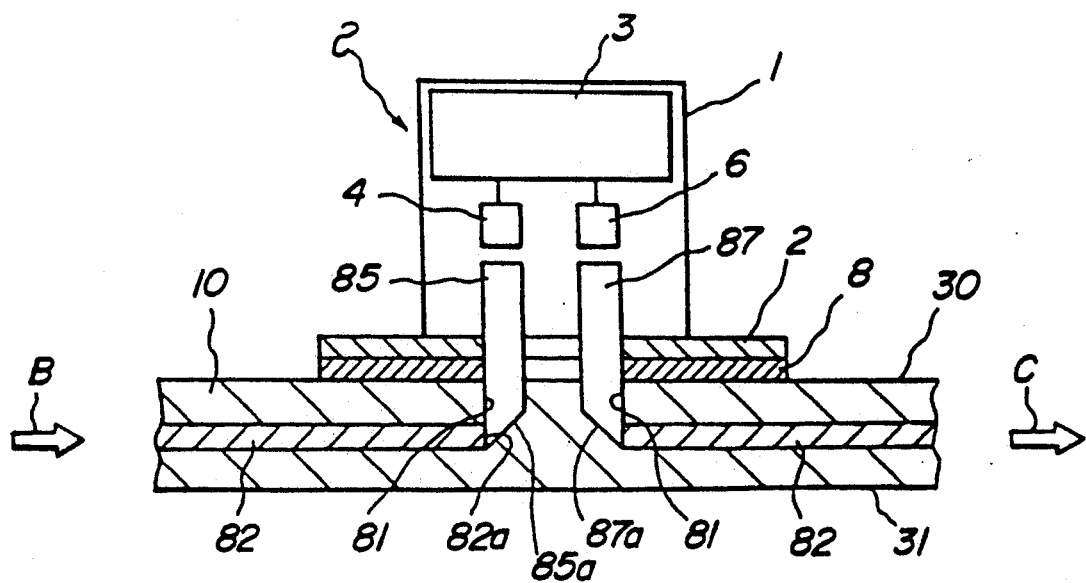
FIG. 22 is a schematic cross-sectional view of another embodiment of an OE-SMD mounted on the substrate.

Referring to FIG. 22, an embodiment of mounting a micro optical device on the substrate of the present invention is shown.

In FIG. 22, an optical wave guide is divided into two in the interior of the glass substrate 10 and end surfaces 82a of the optical wave guides 82 are opposed to each other in the interior of the substrate 10, instead of exposing the end surfaces of the optical wave guides on the front surface of the glass substrate 10.

An OE-SMD 80 accommodates therein an electric circuit part 3, a luminescent element 4, and a light beam-receiving element 6 as well as the upper portion of selfoc lenses 85, 87. A pair of bores 81 are formed in the glass substrate 10 for receiving the selfoc lenses 85, 87, and lower portions of the selfoc lenses 85, 87 are exposed below the front surface 30 through a flange 3 and a rubber cushion 8 and inserted and fixed in the bores 81 to mount the optical electron accumulated device 80 on the front surface 30 of the substrate. The lower end surfaces of the selfoc lenses 85, 87 are connected to the end surfaces 82a of the optical wave guides 82 at the end surfaces In FIG. 22, a light beam transmitted in the optical wave guide 82 as indicated by an arrow B is reflected at a mirror portion 85a to direct upward, and focused by a selfoc lens 85 to incident on a light beam receiving element 4. Similarly, a light beam emanated from a luminescent element 6 is passed through a selfoc lens 87 and reflected at a mirror portion 87a to direct to a right direction, and transmitted in the optical wave guide 82 as indicated by an arrow C. Other structures of the OE-SMD 80 are the same as those of FIGS. 1A and 1B.

In FIG. 22, similarly as in the positioning of the OE-SMD 50 of FIGS. 1A and 1B, the positioning of the OE-SMD 80 can be effected by providing guide pins on the housing 1 at the flange thereof, providing guide holes on the front surface 30 of the glass substrate 10, and fitting the guide pins to the guide holes In the above embodiments of FIGS. 1A-FIG. 5C, the OE-SMD 50 (or 60) can be mounted on the glass substrate 10 under pressure by providing threaded portions on the pin tops of the guide pins 9, protruding the threaded portions of the guide pins from the front surface 31, and threadably engaging nuts or the like threading parts with the threaded portions of the guide pins 9 from the front surface 31.

In the embodiments of FIGS. 1A-5 and 22, the cushion 8 may be made of a resin or the like material, or metal instead of rubber.

In addition, the electric wiring on or below the front surface 30 of the glass substrate 10 may be connected to the electric wiring of the OE-SMD 50 in the manners as shown in FIGS. 2C and 13.

EXAMPLE 15

Figure 23:
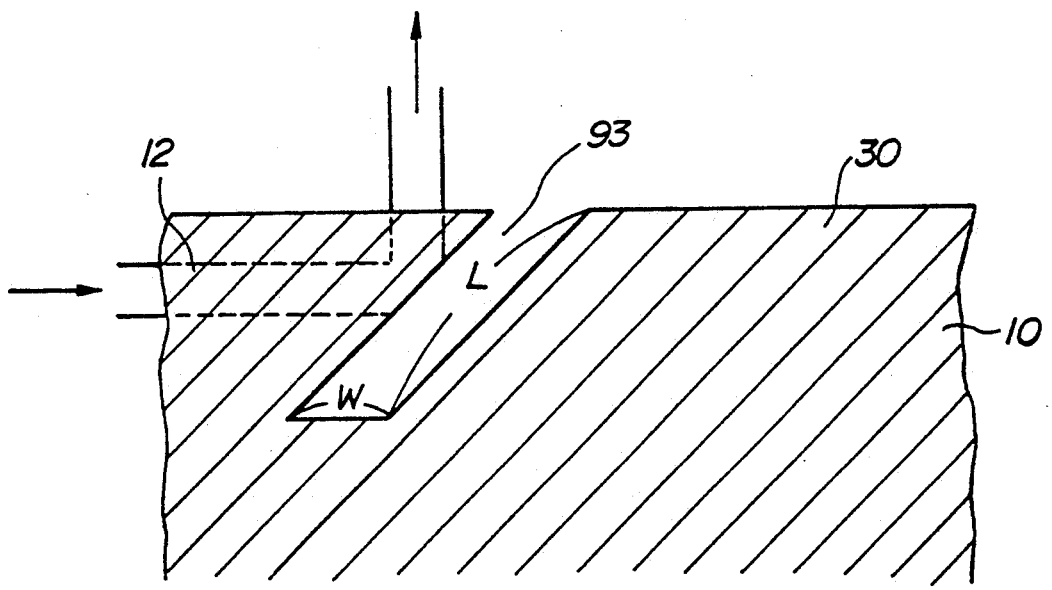
FIG. 23 is a schematic cross-sectional view of an embodiment of an optical wave guide having a slot in the substrate showing a state of refraxing a light beam at the slot.

Referring to FIG. 23, another embodiment of an optical wave guide is shown wherein a light beam is reflected or reflexed upwardly In FIG. 23, a slot 93 is formed obliquely in the substrate 10 to reflect a light beam in the optical wave guide 12, so that a light beam transmitted in the optical wave guide 12 is reflected upwardly by the slot 93 as shown in the drawing. Usually, the slot has a length L larger than 30-50 μm and a width W larger than 5-10 μm and the width W should preferably be at least larger than a few times of wave length of the light beam.

In the optical surface mount circuit of the present invention, an optical part is fixed on the front surface of the substrate by engaging the first guide means positioned and fixed relative to the end surface of the optical wave guide with the second guide means positioned and fixed relative to the optical terminal, and the optical terminal is optically connected to the end surface of the optical wave guide, so that contacting of the end surface of the optical wave guide to the optical terminal can be effected automatically by the engagement of the first and second guide means. Therefore, an optical part can quite easily be mounted on the optical surface mounting circuit without necessitating conventional individual alignment of optical axes of optical parts, so that man-hours for production thereof can extensively reduced. Therefore, complicated optical circuit can be mass-produced, and designing of mounting an optical part on the optical surface mount circuit can be much facilitated as well as change of the designing.

According to the substrate of the present invention for optical surface mount circuits, a light beam transmitted in the optical wave guide is projected from the end surface of the optical wave guide exposed to the front surface of the substrate, or a light beam incidented from the end surface of the optical wave guide is transmitted in the optical wave guide, so that a desired optical circuit can be produced by mounting and fixing an optical part on the front surface, and connecting the inlet/outlet portion of the optical part to the end surfaces of the optical wave guide. Therefore, production, mounting, designing, and change of designing of optical parts can quite easily be performed. Therefore, the present invention is very useful and important as a technique of mounting an optical part on the surface of the optical circuit which is similar to SMT, and gives a large impact on application of optical technique to subscriber system, LAN (local area network), office automation devices, and audio visual devices, etc., in which rapid increases of demand are expected in future.

Also, in the OE-SMD of the present invention has at least an electric circuit part and a signal transducer are provided, the optical axis of the optical terminal is aligned beforehand to the signal transducer and then optically connected to the end surface of the optical wave guide, and the electric circuit part is connected to the electric wiring on the substrate, so that conventional sequential fixing and optical axes alignment of various microoptic parts and electric circuit parts of different size, standard, and shapes on the substrate in the mounting step is not necessary any more. Therefore, mass production, designing, and change of designing of the opto-electronic circuits which perform a light beam/electron transducing process, can be facilitated.

Although the present invention has been explained with specific examples and numeral values, it is of course apparent to those skilled in the art that various changes and modifications thereof are possible without departing from the broad spirit and aspect of the present invention as defined in the appended claims.

What is claimed is:

1. A method of producing a substrate for an optical surface mount circuit, the substrate comprising an optical waveguide formed in an interior portion thereof with an end surface of the waveguide exposed to a front surface of the substrate, the optical waveguide having a zone of refraction gradient which decreases from a central axis thereof toward surrounding portions thereof, said method comprising the steps of:

providing a substantially planar transparent dielectric body containing metallic cations;

forming a first mask on a front surface of said dielectric body to thus define on said front surface at least one first exposed portion substantially in the shape of the optical waveguide;

providing a first salt of at least one metallic cation having a larger ion polarization per unit volume than that of the metallic cations in said dielectric body;

applying said first salt to said at least one first exposed portion of said front surface of said dielectric body to perform a first ion exchange;

removing said first mask from said front surface of said dielectric body;

forming a second mask, substantially in the shape of the end surface of the optical waveguide, on a portion of said at least one first exposed portion to thus define at least one second exposed portion on said front surface of said dielectric body;

providing a second salt of at least one metallic cation having a smaller ion polarization per unit volume than that of the metallic cation in said first salt;

applying said second salt to said at least one second exposed portion of said front surface of said dielectric body to perform a second ion exchange; and removing the second mask from said front surface of said dielectric body.

* * * * *